(12) United States Patent
Furukawa et al.

(10) Patent No.: US 11,996,486 B2
(45) Date of Patent: May 28, 2024

(54) DISPLAY DEVICE

(71) Applicant: SHARP KABUSHIKI KAISHA, Osaka (JP)

(72) Inventors: Hiroaki Furukawa, Sakai (JP); Yuhichi Saitoh, Sakai (JP); Tomohisa Aoki, Sakai (JP); Atsushi Hachiya, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 407 days.

(21) Appl. No.: 17/603,314

(22) PCT Filed: Apr. 26, 2019

(86) PCT No.: PCT/JP2019/018026
§ 371 (c)(1),
(2) Date: Oct. 12, 2021

(87) PCT Pub. No.: WO2020/217479
PCT Pub. Date: Oct. 29, 2020

(65) Prior Publication Data
US 2022/0209021 A1 Jun. 30, 2022

(51) Int. Cl.
*H01L 27/14* (2006.01)
*H01L 29/786* (2006.01)
*H10K 59/121* (2023.01)
*H10K 59/131* (2023.01)

(52) U.S. Cl.
CPC .... *H01L 29/78672* (2013.01); *H01L 29/7869* (2013.01); *H10K 59/1213* (2023.02); *H10K 59/1216* (2023.02); *H10K 59/131* (2023.02)

(58) Field of Classification Search
CPC .......... H01L 29/78672; H01L 29/7869; H01L 27/124; H01L 27/1225; H10K 59/1213; H10K 59/1216; H10K 59/131
USPC ..................................... 257/59, 72
See application file for complete search history.

(56) References Cited

U.S. PATENT DOCUMENTS

| 11,088,284 | B2 * | 8/2021 | Son ..................... H01L 27/1222 |
| 2006/0028861 | A1 | 2/2006 | Han et al. |
| 2008/0089163 | A1 | 4/2008 | Han et al. |
| 2009/0185407 | A1 | 7/2009 | Park et al. |
| 2009/0224330 | A1 | 9/2009 | Hong et al. |
| 2009/0294863 | A1 | 12/2009 | Han et al. |
| 2011/0266623 | A1 | 11/2011 | Han et al. |
| 2012/0287025 | A1 | 11/2012 | Inoue et al. |
| 2013/0069055 | A1 | 3/2013 | Yamazaki et al. |
| 2015/0243220 | A1 | 8/2015 | Kim et al. |

(Continued)

FOREIGN PATENT DOCUMENTS

| JP | 2006-049914 A | 2/2006 |
| JP | 2012-252329 A | 12/2012 |

(Continued)

*Primary Examiner* — Tan N Tran
(74) *Attorney, Agent, or Firm* — ScienBiziP, P.C.

(57) ABSTRACT

A crystalline silicon semiconductor layer includes a first channel region and a second conductor region. An oxide semiconductor layer includes a second channel region and a second conductor region. An lower metal layer includes a lower wire. The lower wire is in contact with a first conductor region in a first contact hole. The first conductor region and the second conductor region are electrically connected together through the lower wire.

20 Claims, 11 Drawing Sheets

(56) References Cited

U.S. PATENT DOCUMENTS

| | | |
|---|---|---|
| 2015/0255490 A1 | 9/2015 | Miyairi |
| 2016/0351122 A1 | 12/2016 | Jung et al. |
| 2016/0380007 A1 | 12/2016 | Miyairi |
| 2018/0197474 A1 | 7/2018 | Jeon et al. |

FOREIGN PATENT DOCUMENTS

| | | |
|---|---|---|
| JP | 2013-084925 A | 5/2013 |
| JP | 2015-188070 A | 10/2015 |
| JP | 2018-195747 A | 12/2018 |

\* cited by examiner

DISPLAY DEVICE

TECHNICAL FIELD

The disclosure relates to display devices.

BACKGROUND ART

Patent Literature 1 discloses a semiconductor circuit including transistors with a silicon semiconductor layer and transistors with an oxide semiconductor layer, all disposed on a common substrate.

CITATION LIST

Patent Literature

Patent Literature 1: Japanese Unexamined Patent Application Publication, Tokukai, No. 2018-195747

SUMMARY

Technical Problem

When a conductor region of the silicon semiconductor layer and a conductor region of the oxide semiconductor layer are electrically connected together, there will likely be created an undesirably large contact resistance between the conductor regions.

Solution to Problem

The disclosure, in an aspect thereof, a display device including a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order, a first transistor including the crystalline silicon semiconductor layer and a second transistor including the oxide semiconductor layer, the crystalline silicon semiconductor layer including a first channel region and a first conductor region, the oxide semiconductor layer including a second channel region and a second conductor region, wherein the first gate insulating film and the first interlayer insulating film are provided with a first contact hole exposing the first conductor region and electrically connecting together the first conductor region and the second conductor region, the lower metal layer includes a lower wire, the lower wire is in contact with the first conductor region in the first contact hole, and the first conductor region and the second conductor region are electrically connected together through the lower wire.

Advantageous Effects of Disclosure

The disclosure, in an aspect thereof, can reduce contact resistance between a conductor region of a silicon semiconductor layer and a conductor region of an oxide semiconductor layer.

DESCRIPTION OF EMBODIMENTS

FIG. 1(a) is a schematic plan view of a structure of a display device in accordance with the present embodiment, and FIG. 1(b) is a cross-sectional view of the structure of the display device.

Figure 1:
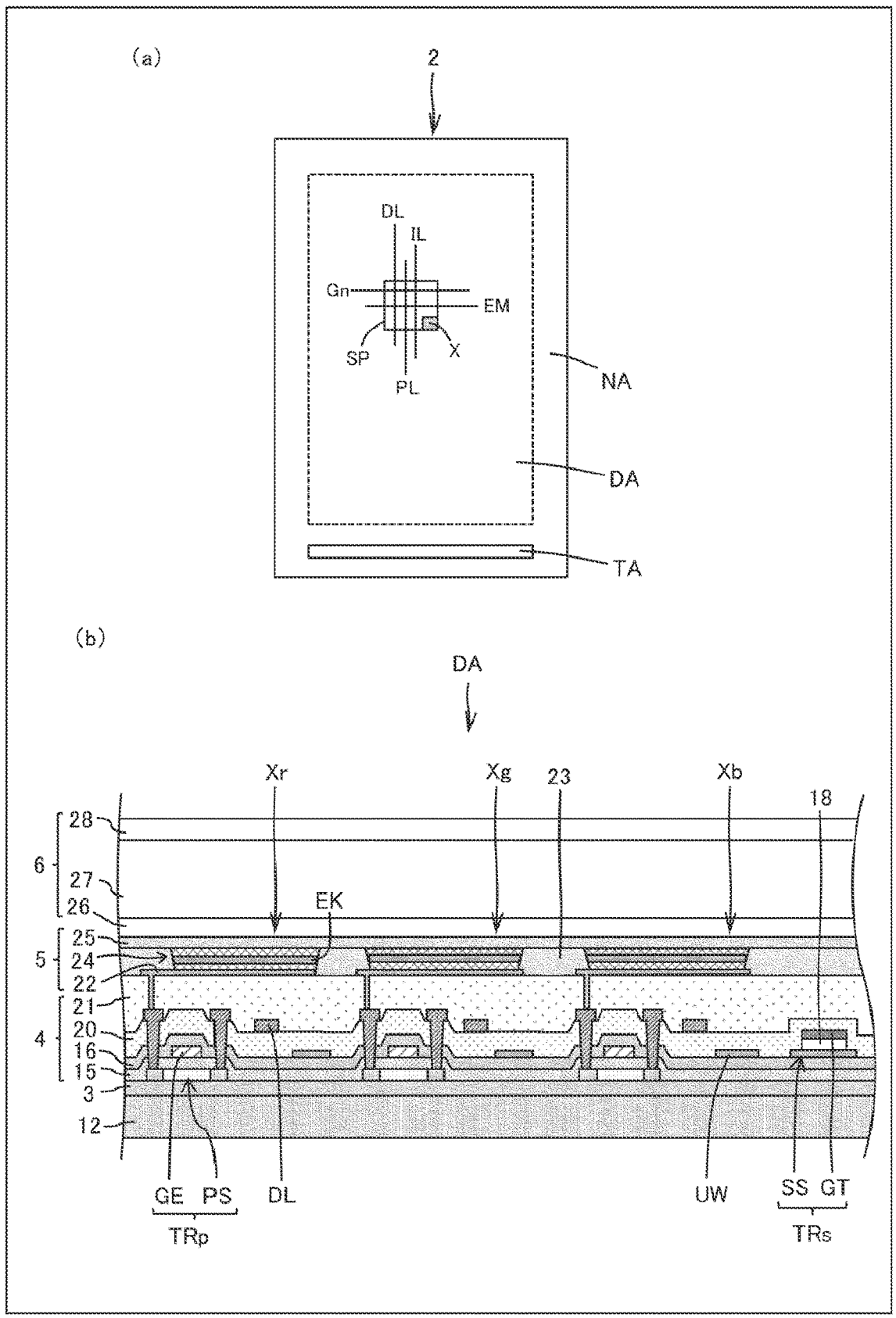
FIG. 1(a) is a schematic plan view of a structure of a display device in accordance with the present embodiment.
FIG. 1(b) is a cross-sectional view of the structure of the display device.

Referring to FIG. 1, a display device 2 includes a base coat film 3, a TFT layer 4, a top-emission (light is emitted upwards) light-emission element layer 5, and a sealing layer 6, all disposed in this sequence on a substrate 12. The display device 2 further includes, in a display area DA thereof, a plurality of subpixels SP each including a self-luminous element X. The display device 2 has a terminal area TA in a frame area NA surrounding the display area DA.

The substrate 12 is either a glass substrate or a flexible base member made primarily of a resin such as polyimide. The substrate 12 may be made of, for example, two polyimide films and an inorganic film interposed between these two polyimide films. The base coat film (undercoat layer) 3 is an inorganic insulation layer preventing foreign materials such as water and oxygen from reaching the interior and may be made of, for example, silicon nitride or silicon oxide.

Referring to FIG. 1(b), the TFT (thin film transistor) layer 4 includes: a crystalline silicon semiconductor layer PS overlying the base coat film 3; a first gate insulating film 15 overlying the crystalline silicon semiconductor layer PS; a first metal layer M1 (containing gate electrodes GE) overlying the first gate insulating film 15; a first interlayer insulating film 16 overlying the first metal layer M1; a second metal layer M2 (containing a lower metal layer and lower wires UW) overlying the first interlayer insulating film 16; an oxide semiconductor layer SS overlying the second metal layer M2; a second gate insulating film 18 overlying the oxide semiconductor layer SS; a third metal layer M3 (containing gate electrodes GT) overlying the second gate insulating film 18; a second interlayer insulating film 20 overlying the third metal layer M3; a fourth metal layer M4 (containing a lower metal layer and data signal lines DL) overlying the second interlayer insulating film 20; and a planarization film 21 overlying the fourth metal layer M4.

The crystalline silicon semiconductor layer PS is made of, for example, a low-temperature polysilicon (LTPS). The oxide semiconductor layer SS is composed of, for example, oxygen and at least one of elements selected from indium (In), gallium (Ga), tin (Sn), hafnium (Hf), zirconium (Zr), and zinc (Zn). Specific examples of such materials include oxide semiconductors containing indium (In), gallium (Ga), zinc (Zn), and oxygen (InGaZnO), oxide semiconductors containing indium (In), tin (Sn), zinc (Zn), and oxygen (InSnZnO), oxide semiconductors containing indium (In), zirconium (Zr), zinc (Zn), and oxygen (InZrZnO), and oxide semiconductors containing indium (In), hafnium (Hf), zinc (Zn), and oxygen (InHfZnO).

FIG. 1(b) shows a first transistor TRp structured to include one of the gate electrodes GE and the crystalline silicon semiconductor layer PS and a second transistor TRs structured to include one of the gate electrodes GT and the oxide semiconductor layer SS.

The first metal layer M1, the second metal layer M2, the third metal layer M3, and the fourth metal layer M4 are made of, for example, a monolayer or multilayered film of at least one of metals of aluminum, tungsten, molybdenum, tantalum, chromium, titanium, and copper.

The first gate insulating film 15, the first interlayer insulating film 16, the second gate insulating film 18, and the second interlayer insulating film 20 may be made of, for example, a silicon oxide (SiOx) film or a silicon nitride (SiNx) film formed by CVD or a stack of these films. The planarization film 21 may be made of, for example, an organic material, such as polyimide or acrylic resin, that can be provided by printing or coating technology.

The light-emission element layer 5 includes: first electrodes (lower electrodes) 22 overlying the planarization film 21; an insulating edge cover film 23 covering edges of the first electrodes 22; EL (electroluminescence) layers 24 overlying the edge cover film 23; and a second electrode (upper electrode) 25 overlying the EL layers 24. The edge cover film 23 is formed, for example, by patterning an applied organic material such as polyimide or acrylic resin by photolithography.

Referring to FIG. 1, the light-emission element layer 5 includes, for example, light-emission elements Xr (red), light-emission elements Xg (green), and light-emission elements Xb (blue) formed therein. Each of these light-emission elements includes one of the insular, first electrodes 22, one of the EL layers 24 (containing a light-emitting layer EK), and the second electrode 25. The second electrode 25 is an electrode provided common to a plurality of light-emission elements ("common electrode").

The light-emission elements Xr, Xg, and Xb may be, for example, OLEDs (organic light-emitting diodes) including an organic layer as a light-emitting layer or QLEDs (quantum-dot light-emitting diodes) including a quantum-dot layer as a light-emitting layer.

The EL layer 24 includes, for example, a stack of a hole injection layer, a hole transport layer, the light-emitting layer EK, an electron transport layer, and an electron injection layer that are provided in this sequence when viewed from below. The light-emitting layer is formed in an insular manner for each opening in the edge cover film 23 (i.e., for each subpixel) by vapor deposition, inkjet technology, or photolithography. The other layers are provided either in an insular manner or as a common layer across all the openings. One or more of the hole injection layer, the hole transport layer, the electron transport layer, and the electron injection layer may be omitted.

The first electrode 22 (anode) includes a stack of, for example, ITO (indium tin oxide) and either Ag (silver) or a Ag-containing alloy, so that the first electrode 22 can reflect light. The second electrode 25 (cathode) is made of, for example, a thin film of a metal such as a magnesium-silver alloy, so that the second electrode 25 can transmit light.

When the light-emission elements Xr, Xg, and Xb are OLEDs, holes and electrons recombine in the light-emitting layer EK due to a drive current that flows between the first electrode 22 and the second electrode 25, to produce excitons that transition to the ground state to emit light. When the light-emission elements Xr, Xg, and Xb are QLEDs, holes and electrons recombine in the light-emitting layer EK due to a drive current that flows between the first electrode 22 and the second electrode 25, to produce excitons that transition from the conduction band to the valence band of the quantum dots to emit light.

In FIG. 1(b), the sealing layer 6, covering the light-emission element layer 5, prevents foreign materials such as water and oxygen from reaching the light-emission element layer 5 and may be made of, for example, two inorganic sealing films 26 and 28 and an organic film 27 interposed between these two inorganic sealing films 26 and 28.

Embodiment 1

Figure 2:
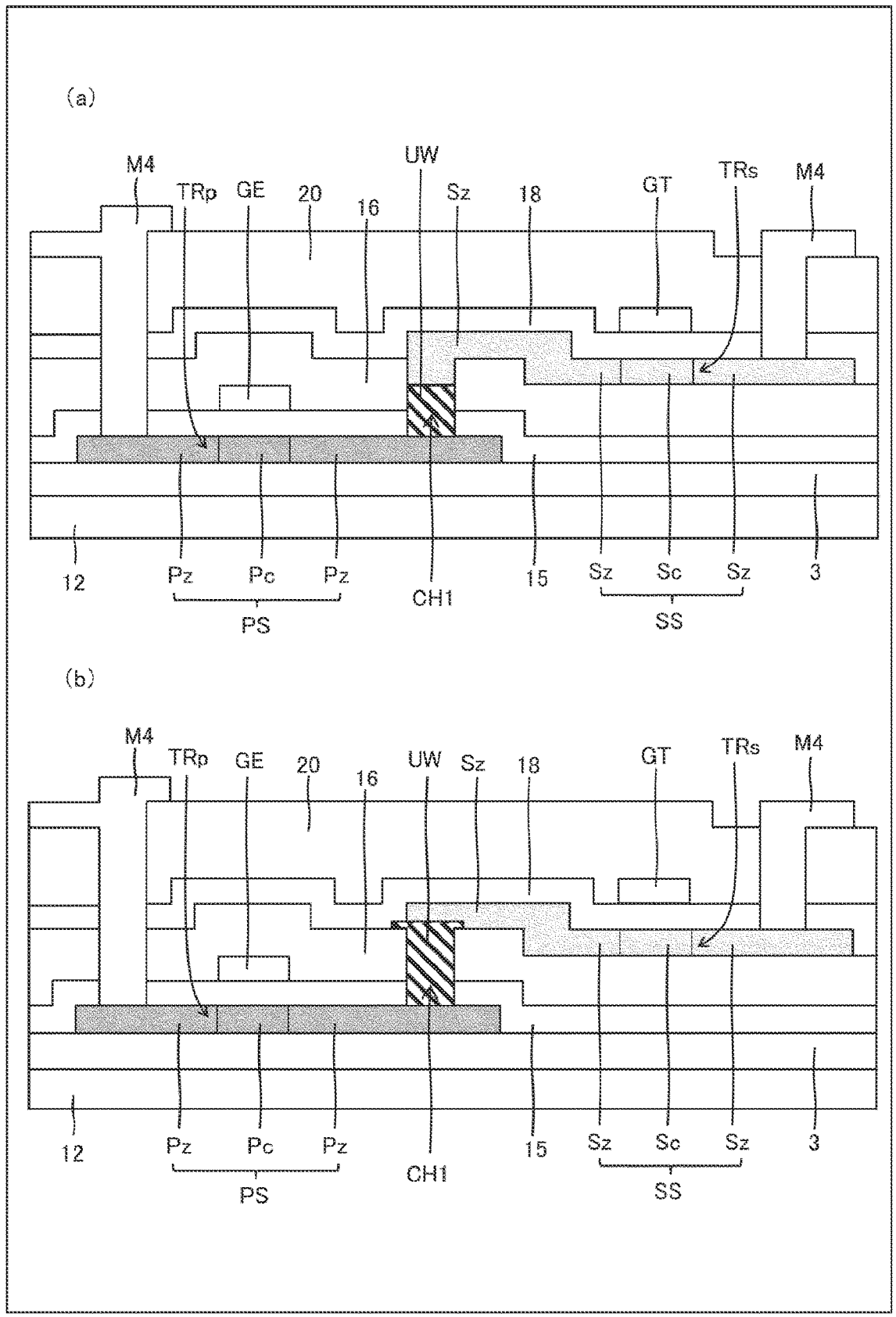
FIG. 2 is a set of cross-sectional views of a structure of a display device in accordance with Embodiment 1.

FIG. 2 is a set of cross-sectional views of a structure of a display device in accordance with Embodiment 1. Referring to FIG. 2, in Embodiment 1, there are provided: a base coat film 3; a crystalline silicon semiconductor layer PS; a first gate insulating film 15; a first metal layer M1 containing a first gate electrode GE; a first interlayer insulating film 16; a second metal layer (lower metal layer) M2; an oxide semiconductor layer SS; a second gate insulating film 18; a third metal layer M3 containing a second gate electrode GT; a second interlayer insulating film 20; and a fourth metal layer (upper metal layer) M4, all on a substrate 12 in this sequence.

In Embodiment 1, each first transistor TRp includes the first gate electrode GE and a first channel region Pc that is a part of the crystalline silicon semiconductor layer PS. Each second transistor TRs includes the second gate electrode GT and a second channel region Sc that is a part of the oxide semiconductor layer SS. The crystalline silicon semiconductor layer PS contains first conductor regions Pz. The oxide semiconductor layer SS contains second conductor regions Sz. The second metal layer M2 contains lower wires UW that are in contact with the second conductor regions Sz.

The first gate insulating film 15 and the first interlayer insulating film 16 have a first contact hole CH1 exposing the first conductor region Pz. The lower wire UW is in contact with the first conductor region Pz in the first contact hole CH1, so that the first conductor region Pz is electrically connected to the second conductor region Sz via the lower wire UW. The lower wire UW may be in contact with the second conductor region Sz inside the first contact hole CH1 as shown in FIG. 2(a) or in contact with the second conductor region Sz outside the first contact hole CH1 as shown in FIG. 2(b).

Embodiment 1 can reduce contact resistance between the first conductor region Pz and the second conductor region Sz in a stable manner in comparison with a structure in which the first conductor region Pz and the second conductor region Sz are in direct contact with each other. This advantage is pronounced when the crystalline silicon semiconductor layer PS is a p-type and the oxide semiconductor layer SS is a n-type (i.e., when a direct contact results in a PN junction, which creates a rectification effect) and when the crystalline silicon semiconductor layer PS is a n-type and the oxide semiconductor layer SS is a n-type (i.e., when ON current densities differ, which entails a directional contact resistance).

Embodiment 1 can also reduce the footprint of the pixel circuit in comparison with a structure in which there are provided separate contact holes over the first conductor regions Pz and over the second conductor regions Sz.

Embodiment 2

Figure 3:
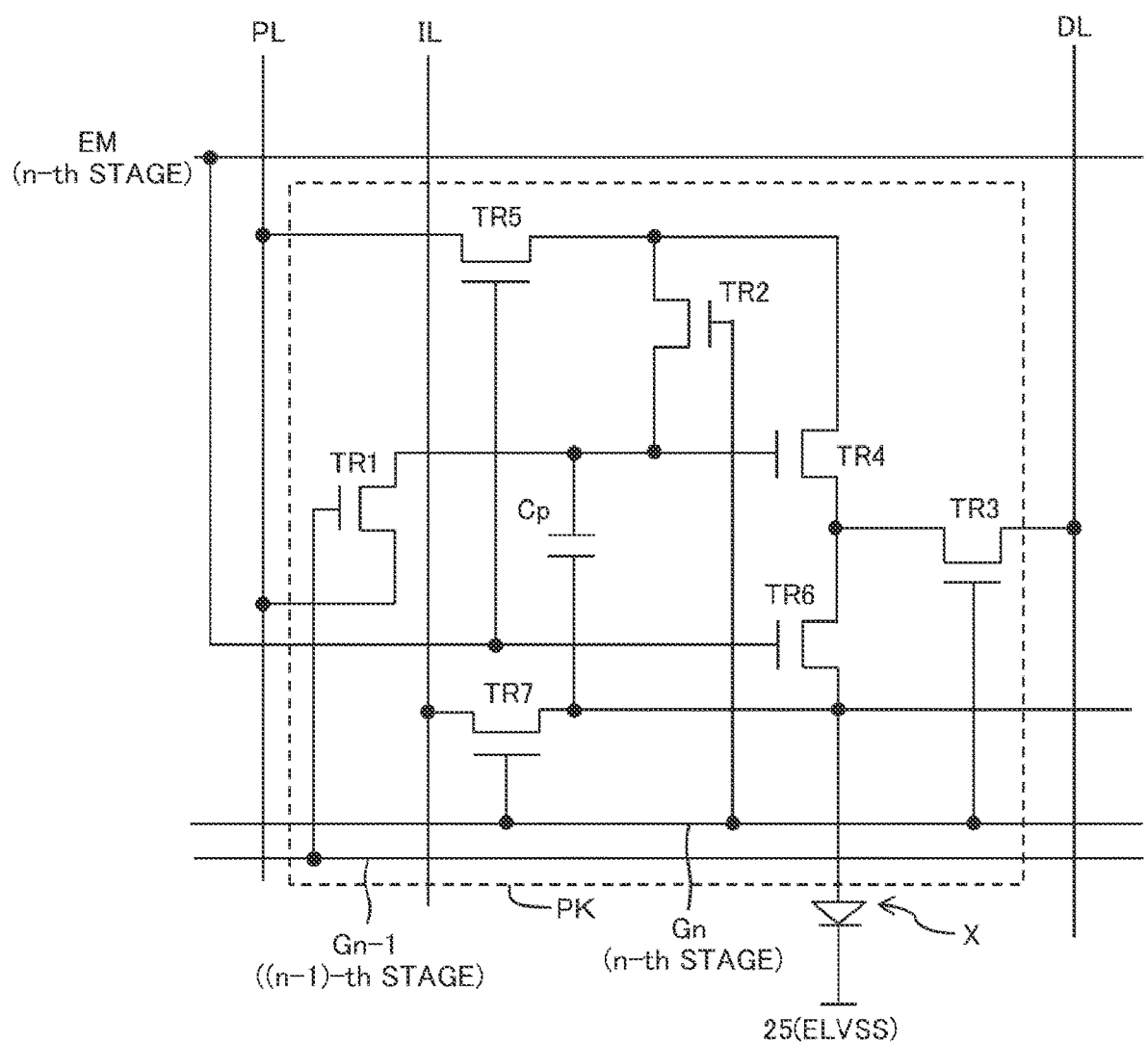
FIG. 3 is a circuit diagram of an exemplary pixel circuit.

FIG. 3 is a circuit diagram of an exemplary pixel circuit in accordance with Embodiment 2. FIG. 1 shows that for each subpixel SP, there are provided: a light-emission element X and a pixel circuit PK for the light-emission element X in the display area DA; and the pixel circuit PK and wiring connected to the pixel circuit PK in the TFT layer 4. The pixel circuit in FIG. 3 is merely illustrative and may take other various structures The pixel circuit PK in FIG. 3 includes: a capacitor Cp; a first initialization transistor TR1 having a gate terminal connected to a scan signal line Gn−1 in the preceding stage ((n−1)-th stage); a threshold control transistor TR2 having a gate terminal connected to a scan signal line Gn in the current stage (n-th stage); a write control transistor TR3 having a gate terminal connected to the scan signal line Gn in the current stage (n-th stage); a drive transistor TR4 for controlling current in the light-emission element X; a power source supply transistor TR5 having a gate terminal connected to a light-emission control line EM (n-th stage); a light-emission control transistor TR6 having a gate terminal connected to the light-emission control line EM (n-th stage); and a second initialization transistor TR7 having a gate terminal connected to the scan signal line Gn in the current stage (n-th stage).

The drive transistor TR4 has a gate terminal connected to the anode of the light-emission element X via the capacitor Cp and also to a high-voltage power source line (which also serves as a first initialization power source line) PL via the first initialization transistor TR1. The drive transistor TR4 has a source terminal connected to a data signal line DL via the write control transistor TR3 and also to the anode of the light-emission element X via the light-emission control transistor TR6. The drive transistor TR4 has a drain terminal connected to the gate terminal of the drive transistor TR4 via the threshold control transistor TR2 and also to the high-voltage power source line PL via the power source supply transistor TR5. The anode of the light-emission element X is connected to a second initialization power source line IL via the second initialization transistor TR7. The second initialization power source line IL and the cathode 25 (common electrode) of the light-emission element X are fed with, for example, the same low-voltage power supply (ELVSS).

Figure 4:
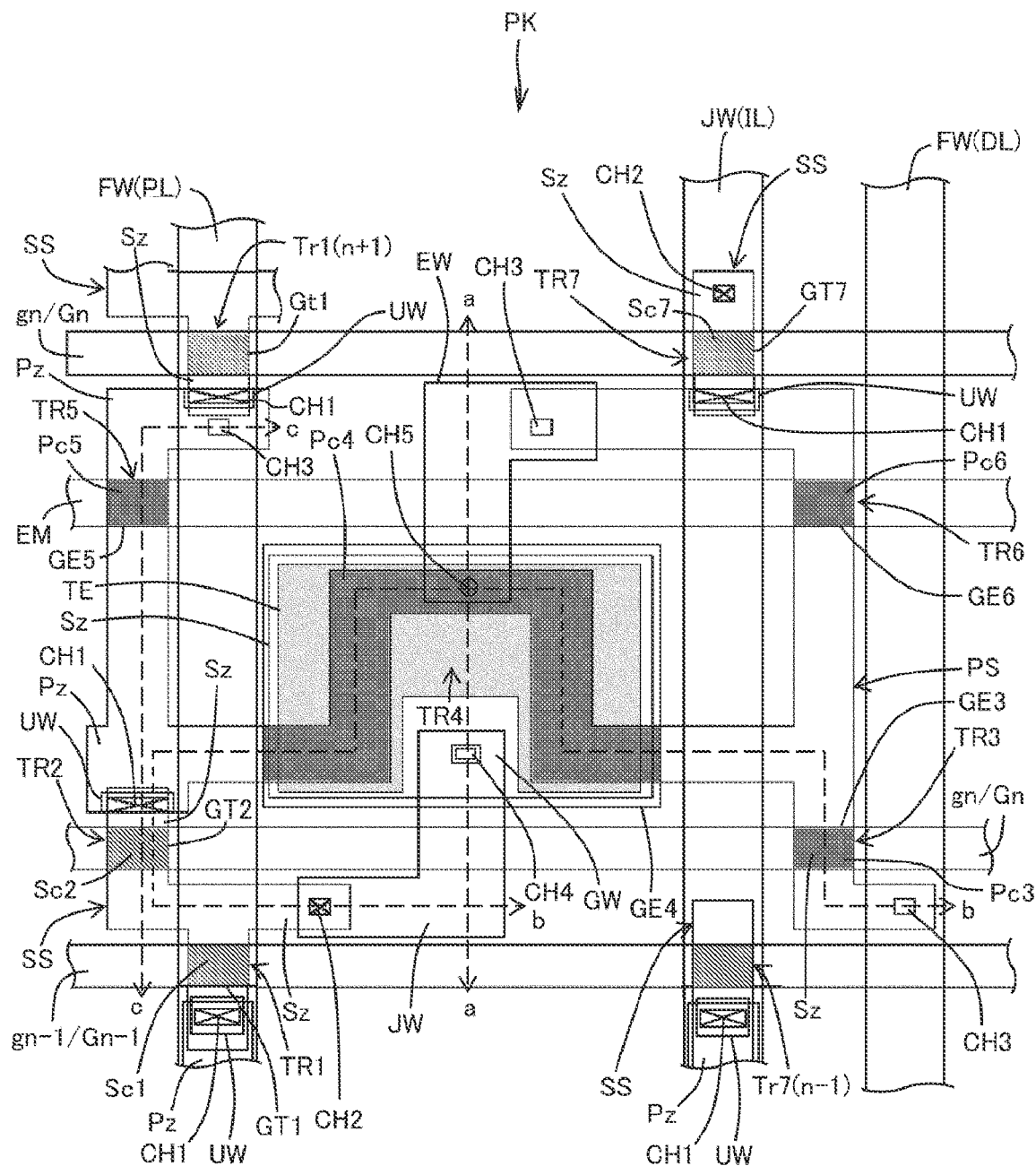
FIG. 4 is a plan view of an exemplary structure of a pixel circuit in a display device in accordance with Embodiment 2.

FIG. 4 is a plan view of an exemplary structure of a pixel circuit in a display device in accordance with Embodiment 2. FIG. 5(a) is a cross-sectional view of the structure shown in FIG. 4 taken along line a-a, FIG. 5(b) is a cross-sectional view of the structure shown in FIG. 4 taken along line b-b, and FIG. 5(c) is a cross-sectional view of the structure shown in FIG. 4 taken along line c-c.

Figure 5:
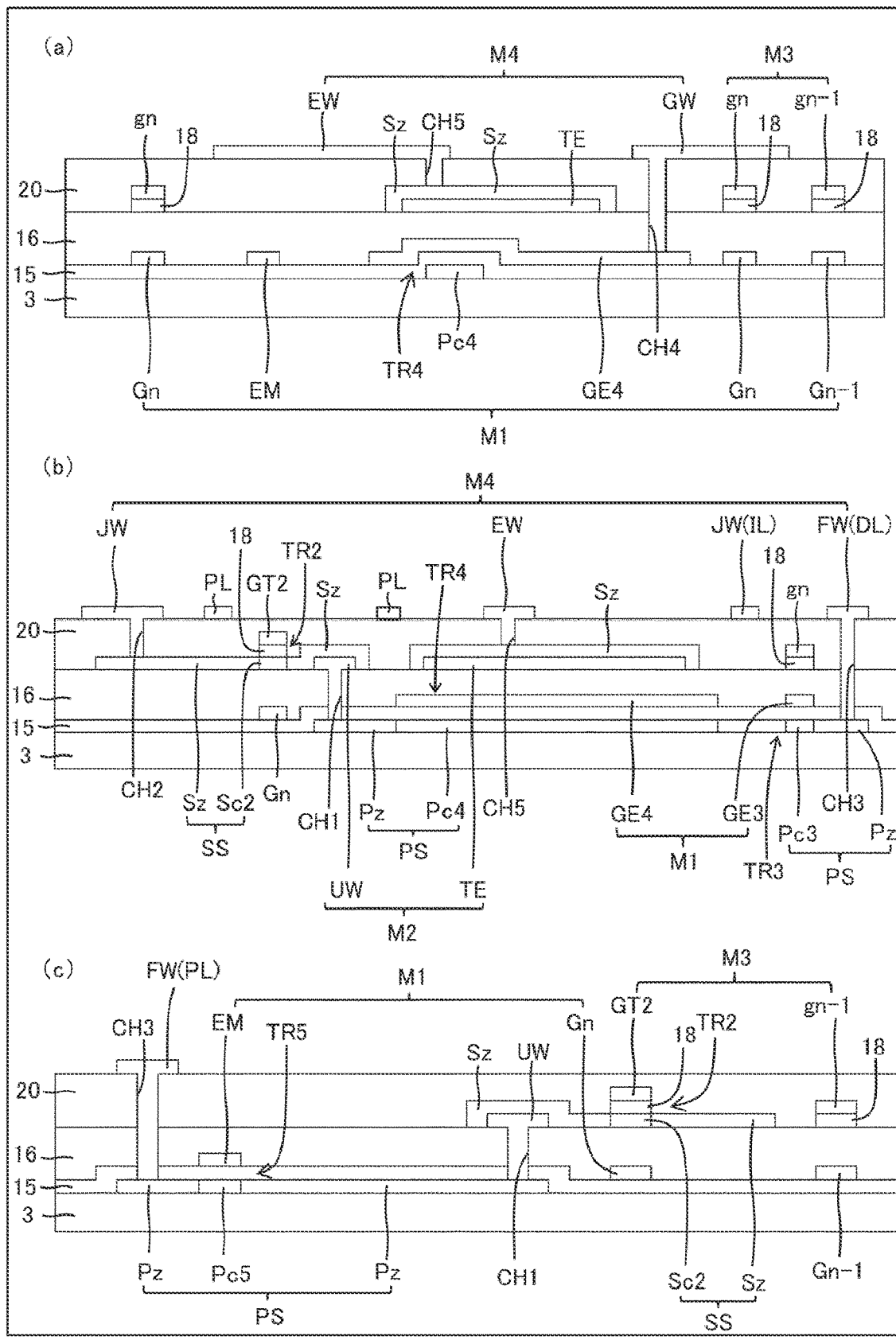
FIG. 5(a) is a cross-sectional view of the structure shown in FIG. 4 taken along line a-a.
FIG. 5(b) is a cross-sectional view of the structure shown in FIG. 4 taken along line b-b.
FIG. 5(c) is a cross-sectional view of the structure shown in FIG. 4 taken along line c-c.

Referring to FIGS. 4 and 5, in Embodiment 2, there are provided: a crystalline silicon semiconductor layer PS; a first gate insulating film 15; a first metal layer M1 containing first gate electrodes GE3 to GE6; a first interlayer insulating film 16; a second metal layer (lower metal layer) M2; an oxide semiconductor layer SS; a second gate insulating film 18; a third metal layer M3 containing second gate electrodes GT1, GT2, and GT7; a second interlayer insulating film 20; and a fourth metal layer (upper metal layer) M4, all on the base coat film 3 in this sequence.

The light-emission control line EM, the first gate electrode GE4, and the lower scan signal lines Gn−1 and Gn reside in the first metal layer M1. An opposite electrode TE and a lower wire UW reside in the second metal layer M2. The upper scan signal lines gn−1 and gn (denoted by Gn−1 and Gn in FIG. 3) reside in the third metal layer M3. The first gate electrode GE3 is a part of the lower scan signal line Gn, and the second gate electrode GT2 is a part of the upper scan signal line gn. An electrode wire EW, an upper wire JW (including the second initialization power source line IL), a metal wire FW (including the high-voltage power source line PL and the data signal line DL), and a gate connection wire GW reside in the fourth metal layer (upper metal layer) M4.

The pixel circuit PK includes: the write control transistor TR3, the drive transistor TR4, the power source supply transistor TR5, and the light-emission control transistor TR6, which are first transistors including the crystalline silicon semiconductor layer PS; and the first initialization transistor TR1, the threshold control transistor TR2, and the second initialization transistor TR7, which are second transistors including the oxide semiconductor layer SS. These transistors are, for example, n-channel transistors. This use of n-channel transistors, for example, enables turning on and off the threshold control transistor TR2, the write control transistor TR3, and the second initialization transistor TR7 by feeding a common scan signal to the control terminals of these transistors. The transistors are however not necessarily n-channel transistors. The transistors including the crystalline silicon semiconductor layer PS may be, for example, p-channel transistors. Additionally, the pixel circuit shown in FIG. 2 is not essential. The disclosure is applicable to general pixel circuits.

The crystalline silicon semiconductor layer PS contains first channel regions Pc3, Pc4, Pc5, and Pc6 and first conductor regions Pz. The oxide semiconductor layer SS contains second channel regions Sc1, Sc2, and Sc7 and second conductor regions Sz.

The first initialization transistor TR1 includes the second channel region Sc1, two of the second conductor regions Sz (source and drain regions) sandwiching the second channel region Sc1, and the second gate electrode GT1 (control terminal). The threshold control transistor TR2 includes the second channel region Sc2, two of the second conductor regions Sz (source and drain regions) sandwiching the second channel region Sc2, and the second gate electrode GT2 (control terminal). The write control transistor TR3 includes the first channel region Pc3, two of the first conductor regions Pz (source and drain regions) sandwiching the first channel region Pc3, and the first gate electrode GE3 (control terminal). The drive transistor TR4 includes the first channel region Pc4, two of the first conductor regions Pz (source and drain regions) sandwiching the first channel region Pc4, and the first gate electrode GE4 (control terminal). The power source supply transistor TR5 includes the first channel region Pc5, two of the first conductor regions Pz (source and drain regions) sandwiching the first channel region Pc5, and the first gate electrode GE5 (control terminal). The light-emission control transistor TR6 includes the first channel region Pc6, two of the first conductor regions Pz (source and drain regions) sandwiching the first channel region Pc6, and the first gate electrode GE6 (control terminal). The second initialization transistor TR7 includes the second channel region Sc7, two of the second conductor regions Sz (source and drain regions) sandwiching the second channel region Sc7, and the second gate electrode GT7 (control terminal).

First Contact Hole

The first gate insulating film 15 and the first interlayer insulating film 16 have a first contact hole CH1 exposing the first conductor region Pz and electrically connecting the first conductor regions Pz to the second conductor regions Sz.

The lower wire UW is in contact with the first conductor region Pz in the first contact hole CH1, so that the first conductor region Pz is electrically connected to the second conductor region Sz via the lower wire UW. The lower wire UW is provided in such an insular manner that the top and side faces of the lower wire UW are covered with the second conductor region Sz.

Second Contact Hole

The second interlayer insulating film 20 has a second contact hole CH2 formed therethrough to electrically connect the second conductor region Sz to the wiring in the fourth metal layer M4 (e.g., the upper wire JW).

Third Contact Hole

The first gate insulating film 15, the first interlayer insulating film 16, and the second interlayer insulating film 20 have a third contact hole CH3 exposing the first conductor region Pz and electrically connecting the first conductor region Pz to the wiring in the fourth metal layer M4 (e.g., the metal wire FW and the electrode wire EW). As shown in FIGS. 5(b), 5(c), and 4, the metal wire FW or the electrode wire EW is in contact with the first conductor region Pz in the third contact hole CH3.

Fourth Contact Hole

The first interlayer insulating film 16 and the second interlayer insulating film 20 have a fourth contact hole CH4 formed therethrough to electrically connect the wiring in the first metal layer M1 (e.g., the first gate electrode GE4) to the wiring in the fourth metal layer M4 (e.g., the gate connection wire GW). Referring to FIG. 5(a), in the fourth contact hole CH4, the first gate electrode GE4 is exposed, and the gate connection wire GW is in contact with the first gate electrode GE4.

Fifth Contact Hole

The second interlayer insulating film 20 has a fifth contact hole CH5 formed therethrough to electrically connect the wiring in the second metal layer M2 (e.g., the opposite electrode TE) to the wiring in the fourth metal layer M4 (e.g., the electrode wire EW). The opposite electrode TE and the first gate electrode GE4, located opposite each other across the first interlayer insulating film 16, form a capacitive element Cp.

As shown in FIGS. 4 and 5, the upper wire JW may be a second initialization line IL. For instance, as shown in FIG. 4, the second conductor region Sz, which is integral to the second channel region Sc7 of the transistor TR7, is in contact with the second initialization line IL in the second contact hole CH2 so that the second conductor region Sz is electrically connected to the second initialization line IL.

The second conductor region Sz covers the top and side faces of the opposite electrode TE and the lower wire UW in the second metal layer (lower metal layer) M2. The second gate insulating film 18 is matched with the third metal layer M3. Alternatively, the second gate insulating film 18 and the third metal layer M3 may be patterned using different mask patterns. In other words, for example, the second gate electrodes GT1 and GT2 and the second gate insulating film 18 are formed such that the edges thereof are matched. In this example, dislocations of approximately 1 to 3 μm are tolerable that may be caused by displacement in patterning and differences in etching rates.

Referring to FIG. 4, the second conductor region Sz located over the first contact hole CH1 and the second conductor region Sz located over the second contact hole CH2 are different conductor regions sandwiching either the same second channel region Sc2 (of the threshold control transistor TR2) or the same second channel region Sc1 (of the first initialization transistor TR1). In other words, one of the second conductor regions Sz is a source region, and the other is a drain region.

The first conductor region Pz located over the first contact hole CH1 and the first conductor region Pz located over the third contact hole CH3 are different conductor regions sandwiching the same first channel region Pc5 (of the power source supply transistor TR5). In other words, one of the first conductor regions Pz is a source region, and the other is a drain region.

FIGS. 4 and 5 show the first gate electrode GE3 for the write control transistor TR3 as a part of the lower scan signal line Gn and the second gate electrode GT2 for the threshold control transistor TR2 as a part of the upper scan signal line gn.

The first gate electrode GE5 of the power source supply transistor TR5 and the first gate electrode GE6 of the light-emission control transistor TR6 are parts of the light-emission control line EM to which a common light-emission control signal is fed.

The second gate electrode GT7 of the second initialization transistor TR7 in the pixel circuit PK in the current stage (n-th stage) and the second gate electrode GO of the first initialization transistor Tr1 (denoted by Tr1(n+1) in FIG. 4) in the pixel circuit PK in the succeeding stage ((n+1)-th stage) are parts of the upper scan signal line gn to which a common scan signal is fed.

The first initialization power source line connected to a conductive electrode of the first initialization transistor TR1 may double as the high-voltage power source line PL. The second initialization power source line IL connected to a conductive electrode of the second initialization transistor TR7 is fed with the same power supply voltage as a second electrode (cathode) of the light-emission element X.

Figure 6:
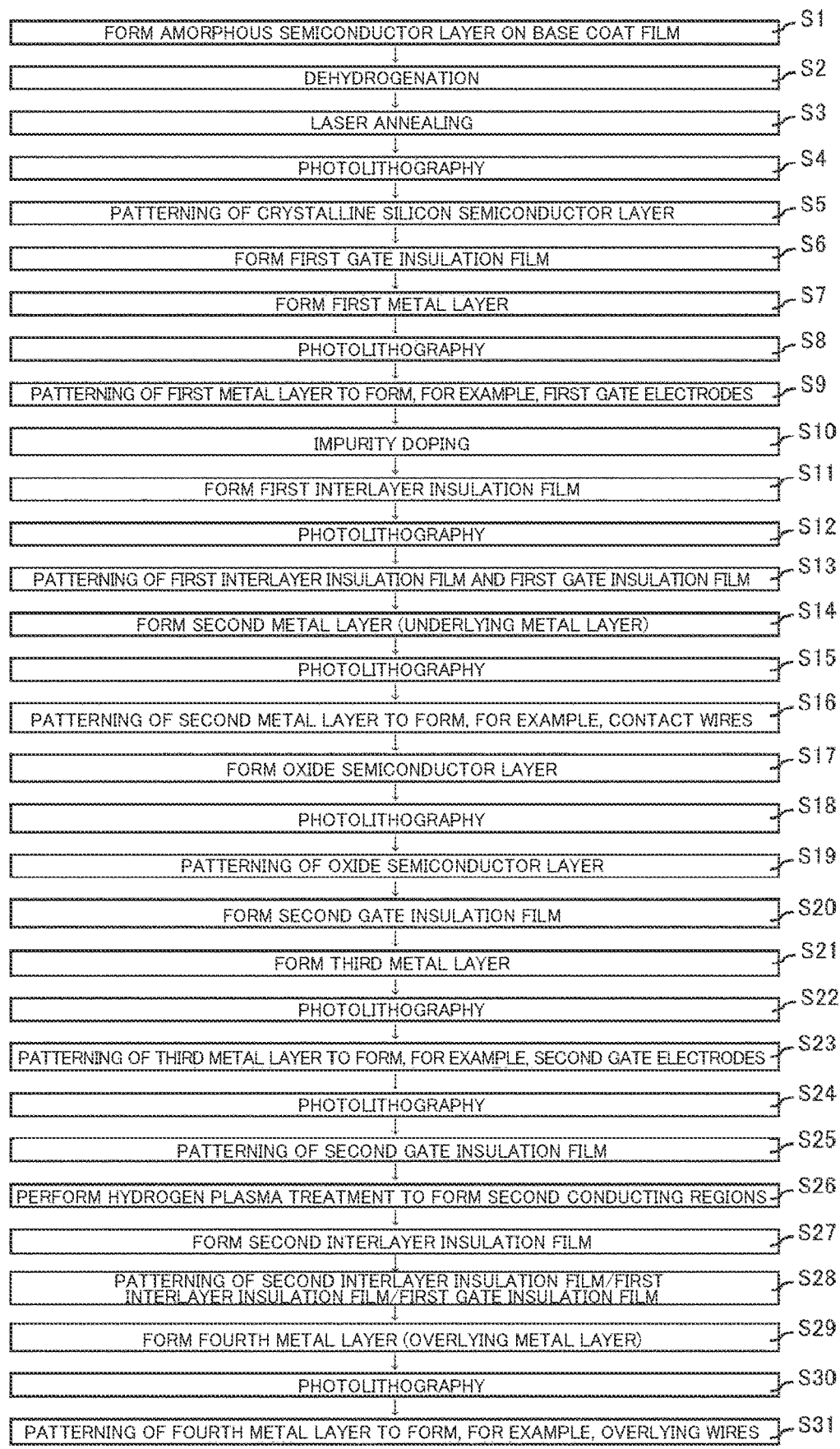
FIG. 6 is a flow chart representing a method of manufacturing a display device in accordance with Embodiment 2.

FIG. 6 is a flow chart representing a method of manufacturing a display device in accordance with Embodiment 2. In step S1, the base coat film 3 is formed on the substrate 12, and then an amorphous semiconductor layer is formed. Step S2 is dehydrogenation, step S3 is laser annealing, and step S4 is photolithography. The crystalline silicon semiconductor layer PS is patterned in step S5. The first gate insulating film 15 is formed in step S6. The first metal layer M1 is formed in step S7. Step S8 is photolithography. In step S9, the first metal layer M1 is patterned to form, for example, the first gate electrodes GE3 to GE6 and the lower scan signal lines Gn. The crystalline silicon semiconductor layer PS is doped with impurity in step S10. In this example, those parts of the crystalline silicon semiconductor layer PS that are not opposite the pattern of the first metal layer (e.g., the first gate electrodes) are doped so as to be conductive, to form the first conductor regions Pz.

The first interlayer insulating film 16 is formed in step S11. Step S12 is photolithography. The first interlayer insulating film 16 and the first gate insulating film 15 are patterned to form the first contact holes CH1 in step 13. The second metal layer M2, which is a lower metal layer, is formed in step S14. Step S15 is photolithography. The second metal layer M2 is patterned to form, for example, the lower wires UW and the opposite electrodes TE in step S16.

The oxide semiconductor layer SS is formed in step S17. Step S18 is photolithography. The oxide semiconductor layer SS is patterned in step S19. The second gate insulating film 18 is formed in step S20. The third metal layer M3 is formed in step S21. Step S22 is photolithography. The third metal layer M3 is patterned to form, for example, the second gate electrodes GT1, GT2, and GT7 and the upper scan signal lines gn and gn−1 in step S23. Step S24 is photolithography. The second gate insulating film 18 is patterned in step S25. Steps S22 to S25 may only involve a single photolithography process if the third metal layer M3 and the second gate insulating film 18 are etched using the resist mask for the third metal layer.

The oxide semiconductor layer SS is subjected to a hydrogen plasma treatment in step S26. In this example, those parts of the oxide semiconductor layer SS that are not opposite the pattern of the third metal layer M3 (e.g., the second gate electrodes) are reduced so as to be conductive, to form the second conductor regions Sz. The second interlayer insulating film 20 is formed in step S27. The second interlayer insulating film 20, the first interlayer insulating film 16, and the first gate insulating film 15 are patterned to form the contact holes CH2 to CH5 in step S28.

The fourth metal layer M4, which is an upper metal layer, is formed in step S29. Step S30 is photolithography. The fourth metal layer M4 is patterned in step S31 to form, for example, the upper wires JW, the electrode wires EW, the metal wires FW, and the gate connection wires GW.

FIGS. 4 and 5 show the first conductor region Pz of the power source supply transistor TR5, which is a first transistor, being connected to the second conductor region Sz of the threshold control transistor TR2, which is a second transistor, via the lower wire UW located over the first contact hole CH1.

In addition, the first conductor region Pz of the light-emission control transistor TR6, which is a first transistor, is connected to the second conductor region Sz of the second initialization transistor TR7, which is a second transistor, via the lower wire UW located over the first contact hole CH1.

Additionally, the first conductor region Pz of the power source supply transistor TR5, which is a first transistor, is connected to the second conductor region Sz of the first initialization transistor Tr1 (in the next stage), which is a second transistor, via the lower wire UW located over the first contact hole CH1.

Embodiment 2 hence can reduce contact resistance between the first conductor region Pz and the second conductor region Sz in a stable manner in comparison with a structure in which the first conductor region Pz and the second conductor region Sz are in direct contact with each other.

Figure 7:
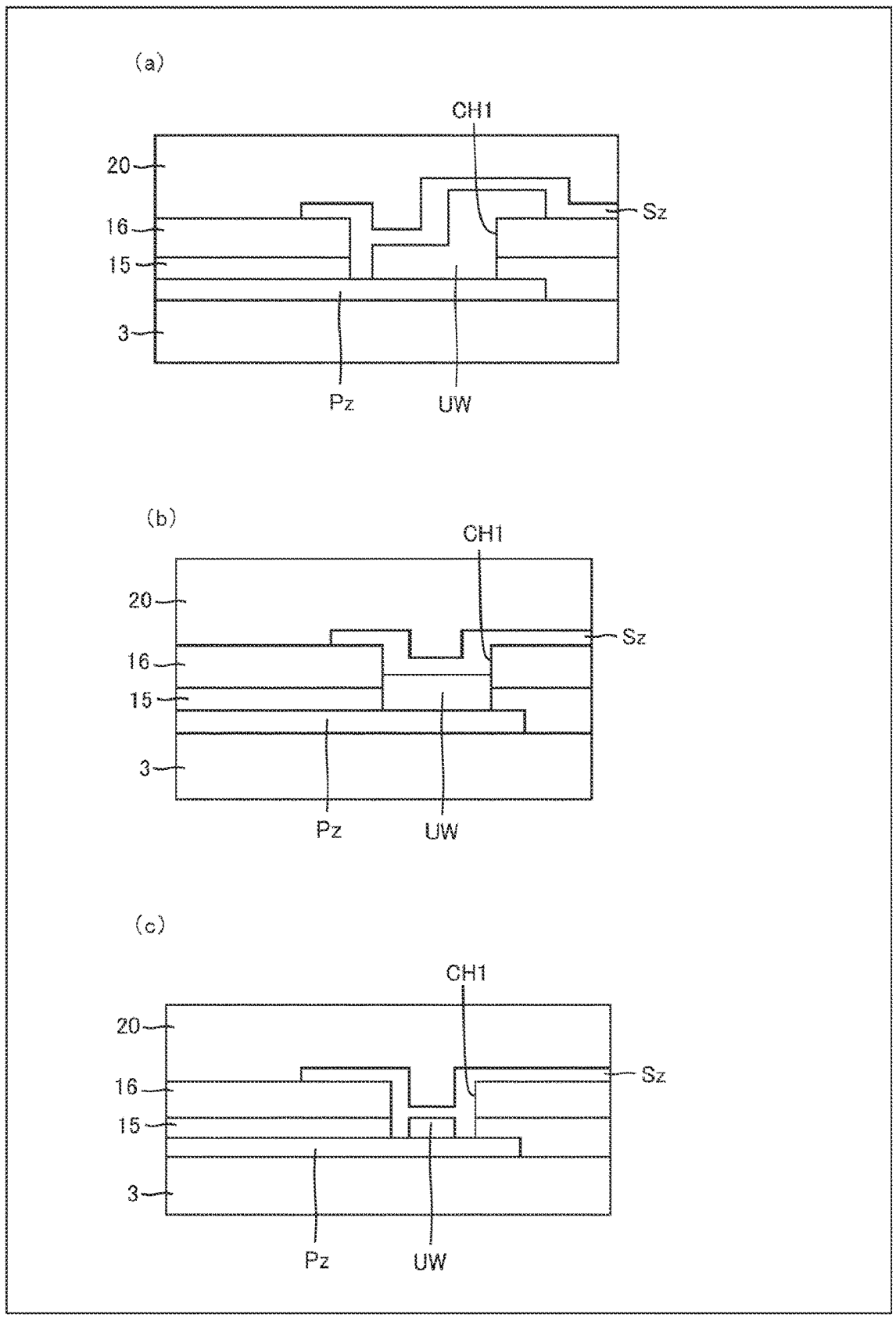
FIG. 7 is a set of cross-sectional views of variation examples of Embodiment 2.

FIG. 7 is a set of cross-sectional views of variation examples of Embodiment 2. FIG. 7(a) shows the lower wire UW having an end thereof inside the first contact hole CH1. The second conductor region Sz is in contact with a part of the first conductor region Pz in the first contact hole CH1. The lower wire UW is covered with the second conductor region Sz and in contact with the first conductor region Pz in the first contact hole CH1. FIG. 7(b) shows the lower wire UW being so matched with the first contact hole CH1 as to go into the first contact hole CH1. The lower wire UW is covered with the second conductor region Sz and in contact with the first conductor region Pz in the first contact hole CH1. FIG. 7(c) shows the lower wire UW being provided in an insular manner in the first contact hole CH1 and the second conductor region Sz being in contact with a part of the first conductor region Pz around the lower wire UW.

Figure 8:
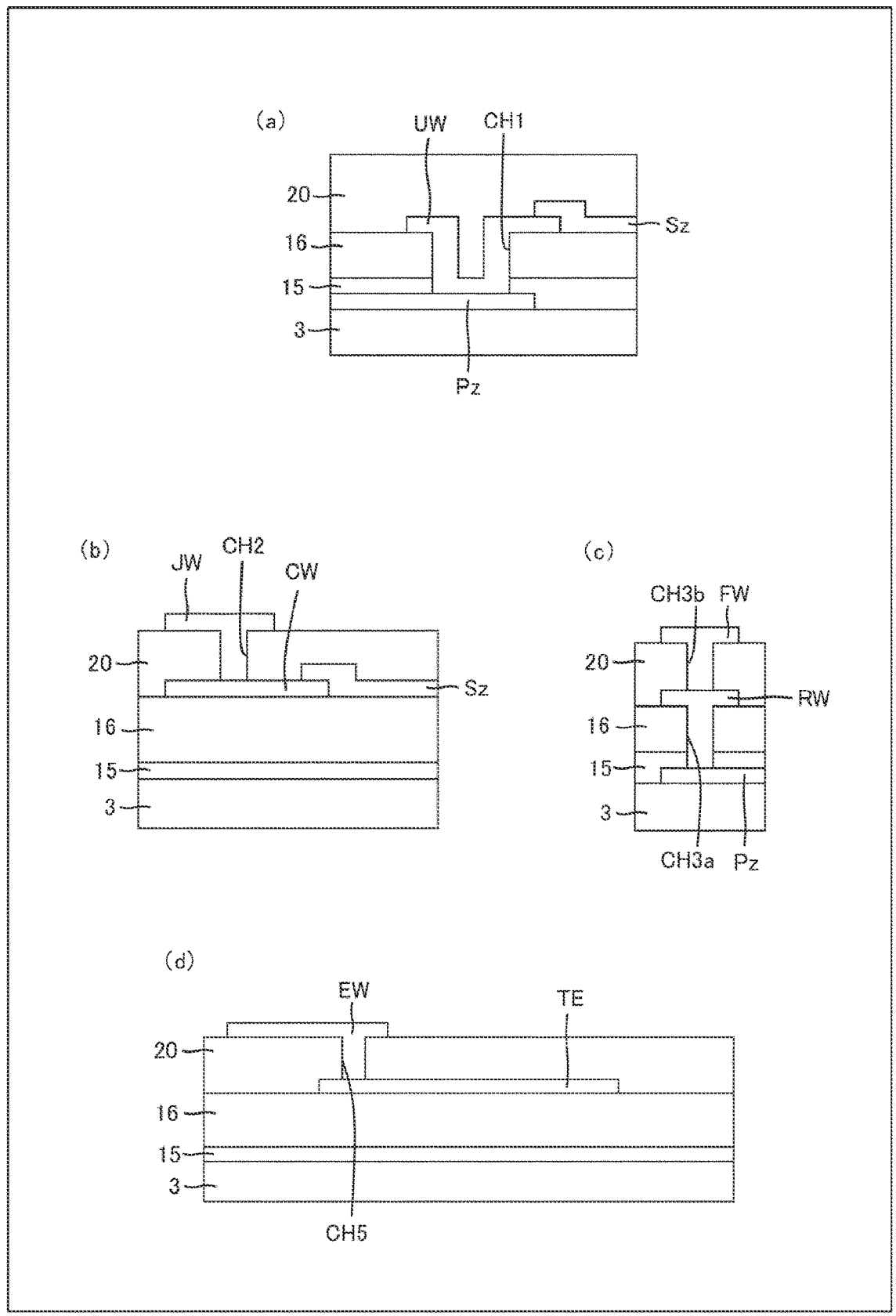
FIG. 8 is a set of cross-sectional views of other variation examples of Embodiment 2.

FIG. 8 is a set of cross-sectional views of other variation examples of Embodiment 2. FIGS. 4 and 5 show a structure around the contact hole CH1 where the second conductor region Sz overlaps the two edges of the lower wire UW that are located opposite each other across the contact hole CH1. This is however not the only possible implementation of the disclosure. Alternatively, as shown in FIG. 8(a), the second conductor region Sz may be in contact with only one of the two edges of the lower wire UW that are located opposite each other across the contact hole CH1, and the lower wire UW may extend on the inner wall and bottom of the contact hole CH1, so that the lower wire UW does not fill the first contact hole CH1.

FIG. 8(b) shows an alternative to the structure around the contact hole CH2 shown in FIGS. 4 and 5. In this alternative, the second metal layer M2 may contain a contact wire CW therein, and the second conductor region Sz may be in contact with only one of the two edges of the contact wire CW that are located opposite each other across the contact hole CH2.

FIG. 8(c) shows an alternative to the structure around the contact hole CH3 shown in FIGS. 4 and 5. In this alternative, the second metal layer M2 (lower metal layer) may contain a relay line RW therein, the first conductor region Pz may be electrically connected to the relay line RW in a contact hole CH3a formed through the first gate insulating film 15 and the first interlayer insulating film 16, and the relay line RW may be electrically connected to the metal wire FW in a contact hole CH3b formed through the second interlayer insulating film 20.

FIGS. 4 and 5 show a structure around the contact hole CH5 where the second conductor region Sz covers the opposite electrode TE. This is however not the only possible implementation of the disclosure. Alternatively, as shown in FIG. 8(d), no second conductor region Sz may cover the opposite electrode TE that is connected to the electrode wire EW via the contact hole CH5.

Embodiment 3

Figure 9:
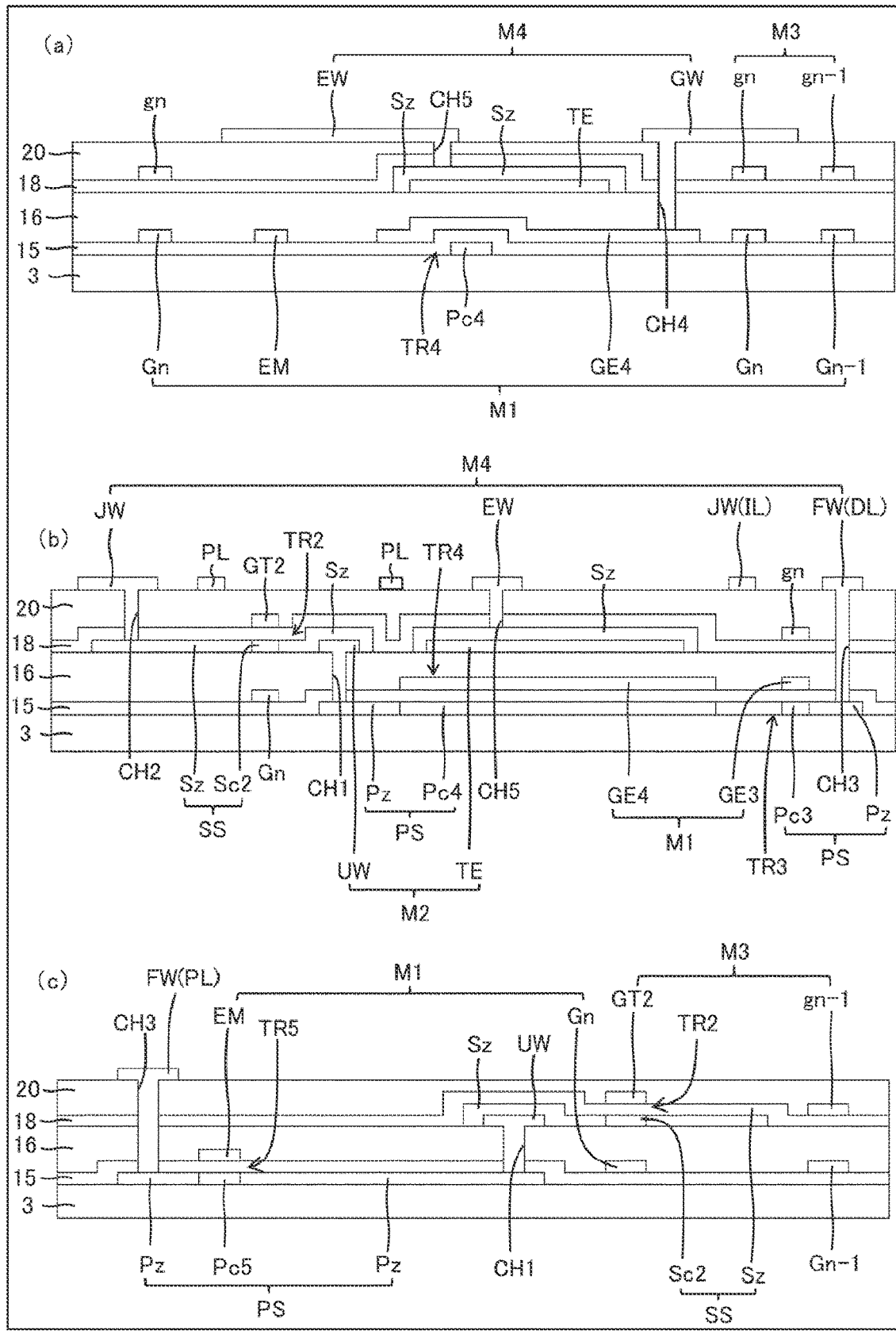
FIG. 9 is a set of cross-sectional views of a structure in accordance with Embodiment 3.
Figure 10:
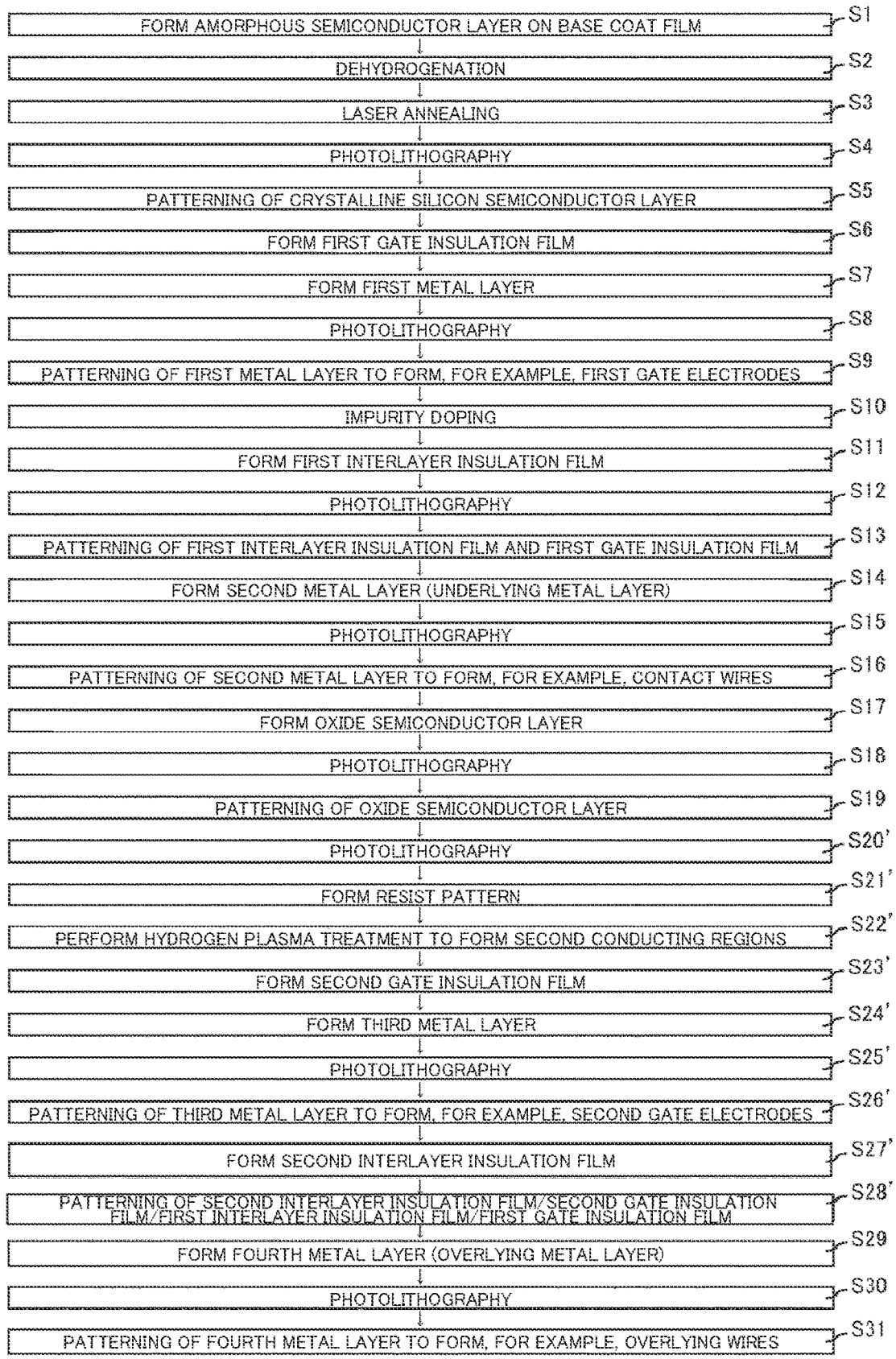
FIG. 10 is a flow chart representing a method of manufacturing a display device in accordance with Embodiment 3.

FIG. 9 is a set of cross-sectional views of a structure in accordance with Embodiment 3. FIG. 10 is a flow chart representing a method of manufacturing a display device in accordance with Embodiment 3. In Embodiment 2 (FIGS. 4 and 5), the pattern of the second gate insulating film 18 is matched with the pattern of the third metal layer M3. This is however not the only possible implementation of the disclosure. Alternatively, the second gate insulating film 18 may be formed across the substrate except for regions corresponding to the contact holes CH2 to CH5, and the second gate insulating film 18 may cover the second conductor region Sz, as shown in FIG. 9.

As summarized in FIG. 10, step S20', which follows steps S1 to S19 in FIG. 6, is photolithography, step S21' is resist patterning, and step S22' is a hydrogen plasma treatment for the formation of the second conductor region. The second gate insulating film 18 is formed in step S23'. The third metal layer M3 is formed in step S24'. Step S25' is photolithography. The third metal layer M3 is patterned to form, for example, the second gate electrodes in step S26'. The second interlayer insulating film 20 is formed in step S27'. The second interlayer insulating film 20, the second gate insulating film 18, the first interlayer insulating film 16, and the first gate insulating film 15 are patterned in step S28'. Steps S29 to S31 are the same as those in FIG. 6. Embodiment 3 is advantageous in that step S25 in FIG. 6 is not needed.

Embodiment 4

Figure 11:
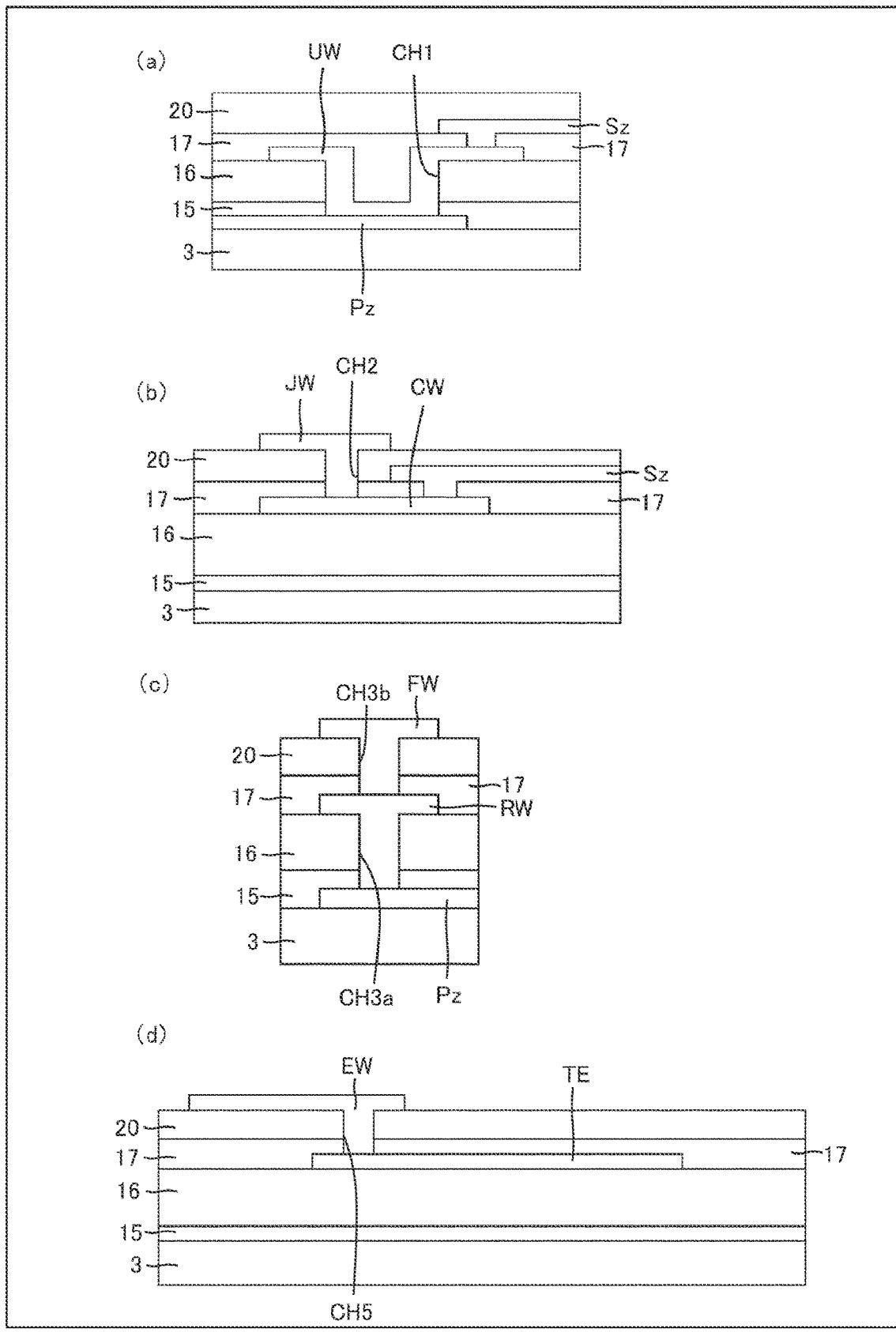
FIG. 11 is a set of cross-sectional views of variation examples of Embodiment 4.

FIG. 11 is a set of cross-sectional views of structures (variation examples of the contact holes) in accordance with Embodiment 4.

In Embodiment 4, there is provided a third interlayer insulating film 17 overlying the second metal layer M2 (containing the lower wires UW, the contact wires CW, and the opposite electrodes TE) and also underlying the oxide semiconductor layer SS (containing the second conductor regions Sz).

FIG. 11(a) shows the second conductor region Sz being in contact with the lower wire UW inside an opening through the third interlayer insulating film 17. The lower wire UW is in contact with the first conductor region Pz inside the first contact hole CH1 that runs through the first gate insulating film 15 and the first interlayer insulating film 16. The first conductor region Pz is electrically connected to the second conductor region Sz via the lower wire UW. The second conductor region Sz overlaps only one of the two edges of the lower wire UW that are located opposite each other across the contact hole CH1 (not the other edge), and the lower wire UW extends on the inner wall and bottom of the contact hole CH1, so that the lower wire UW does not fill the first contact hole CH1.

FIG. 11(b) shows the second metal layer M2 containing the contact wire CW. The second interlayer insulating film 20 and the third interlayer insulating film 17 have the second contact hole CH2 exposing the contact wire CW. The upper wire JW is in contact with the contact wire CW inside the second contact hole CH2. The second conductor region Sz is electrically connected to the upper wire JW via the contact wire CW. The second conductor region Sz overlaps only one of the two edges of the contact wire CW that are located opposite each other across the contact hole CH2 (not the other edge).

FIG. 11(c) shows the second metal layer M2 (lower metal layer) containing the relay line RW. The first conductor region Pz is electrically connected to the relay line RW via a lower, third contact hole CH3a that runs through the first gate insulating film 15 and the first interlayer insulating film 16. The relay line RW is electrically connected to the metal wire FW via an upper, third contact hole CH3b that runs through the third interlayer insulating film 17 and the second interlayer insulating film 20.

FIG. 11(d) shows the second interlayer insulating film 20 and the third interlayer insulating film 17 having the fifth contact hole CH5 exposing the opposite electrode TE. The electrode wire EW is in contact with, and hence electrically connected to, the opposite electrode TE inside the fifth contact hole CH5.

The embodiments and examples described so far are for illustrative purposes only and by no means limit the scope of the disclosure. It is obvious to the person skilled in the art that many modifications and variations are possible based on the description.

Aspect 1

A display device including a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order, a first transistor including the crystalline silicon semiconductor layer and a second transistor including the oxide semiconductor layer, the crystalline silicon semiconductor layer including a first channel region and a first conductor region, the oxide semiconductor layer including a second channel region and a second conductor region, wherein the first gate insulating film and the first interlayer insulating film are provided with a first contact hole exposing the first conductor region and electrically connecting together the first conductor region and the second conductor region, the lower metal layer includes a lower wire, the lower wire is in contact with the first conductor region in the first contact hole, and the first conductor region and the second conductor region are electrically connected together through the lower wire.

Aspect 2

The display device according to, for example, aspect 1, wherein the lower wire is provided in such an insular manner that the lower wire has a top face and side faces thereof covered with the second conductor region.

Aspect 3

The display device according to, for example, aspect 1 or 2, further including a third interlayer insulating film provided between the lower metal layer and the oxide semiconductor layer.

Aspect 4

The display device according to, for example, any one of aspects 1 to 3, wherein the second gate insulating film is provided to match the second gate electrode.

Aspect 5

The display device according to, for example, any one of aspects 1 to 4, wherein the second gate insulating film covers a top face and side faces of the second conductor region.

Aspect 6

The display device according to, for example, aspect 1 or 2, wherein the upper metal layer includes an upper wire, the second interlayer insulating film has a second contact hole exposing the second conductor region and electrically connecting together the second conductor region and the upper wire, and the upper wire is in contact with the second conductor region in the second contact hole.

Aspect 7

The display device according to, for example, aspect 1, wherein the second conductor region is in contact with a part of the first conductor region in the first contact hole.

Aspect 8

The display device according to, for example, aspect 1, wherein the lower wire has an end thereof in the first contact hole.

Aspect 9

The display device according to, for example, aspect 1, wherein the lower wire is provided in an insular manner in the first contact hole, and the second conductor region is in contact with a part of the first conductor region around the lower wire.

Aspect 10

The display device according to, for example, any one of aspects 1 to 9, wherein the upper metal layer includes a metal wire, the first gate insulating film, the first interlayer insulating film, and the second interlayer insulating film are provided with a third contact hole exposing the first conductor region and electrically connecting together the first conductor region and the metal wire, and in the third contact hole, the metal wire is in contact with the first conductor region.

Aspect 11

The display device according to, for example, any one of aspects 1 to 10, wherein the upper metal layer includes a gate connection wire, the first interlayer insulating film and the second interlayer insulating film are provided with a fourth contact hole exposing the first gate electrode and electrically connecting together the first gate electrode and the gate connection wire, and in the fourth contact hole, the gate connection wire is in contact with the first gate electrode.

Aspect 12

The display device according to, for example, any one of aspects 1 to 11, wherein the lower metal layer includes an opposite electrode, the upper metal layer includes an electrode wire, the second interlayer insulating film is provided with a fifth contact hole exposing the second conductor region, and the second conductor region covering the opposite electrode is in contact with the electrode wire in the fifth contact hole.

Aspect 13

The display device according to, for example, aspect 6, wherein the second conductor region located over the first contact hole and the second conductor region located over the second contact hole are different conductor regions sandwiching the same second channel region.

Aspect 14

The display device according to, for example, aspect 10, wherein the first conductor region located over the first contact hole and the first conductor region located over the third contact hole are different conductor regions sandwiching the same first channel region.

Aspect 15

The display device according to, for example, any one of aspects 1 to 14, further including: a light-emission element; and a pixel circuit configured to control the light-emission element, the light-emission element and the pixel circuit corresponding to a sub-pixel, wherein the pixel circuit includes: a drive transistor configured to control a current of the light-emission element; a first initialization transistor connected between a first initialization power source line and a control terminal of the drive transistor; a threshold control transistor connected between a drain region and the control terminal of the drive transistor; a write control transistor connected between a source region of the drive transistor and a data signal line; a power source supply transistor connected between the drain region of the drive transistor and a high-voltage power source line; a light-emission control transistor connected between the source region of the drive transistor and a first electrode of the light-emission element; a second initialization transistor connected between the first electrode of the light-emission element and a second initialization power source line; and a capacitor connected to the control terminal of the drive transistor and configured to hold a data signal.

Aspect 16

The display device according to, for example, aspect 15, wherein the drive transistor is the first transistor.

Aspect 17

The display device according to, for example, aspect 15, wherein the lower metal layer is an opposite electrode, and the first gate electrode and the opposite electrode, overlapping via the first interlayer insulating film, form a capacitor.

Aspect 18

The display device according to, for example, aspect 15, wherein at least one of the first initialization transistor, the threshold control transistor, and the second initialization transistor is the second transistor.

Aspect 19

The display device according to, for example, aspect 15, wherein the threshold control transistor is the second transistor, the write control transistor is the first transistor, the first gate electrode corresponding to the write control transistor is a portion of a lower scan signal line, and the second gate electrode corresponding to the threshold control transistor is a portion of an upper scan signal line, and the lower scan signal line and the upper scan signal line receive a scan signal in common between the lower scan signal line and the upper scan signal line.

Aspect 20

The display device according to, for example, aspect 15, wherein each of the power source supply transistor and the light-emission control transistor includes the first transistor, and each of the first gate electrode for the power source supply transistor and the first gate electrode for the light-emission control transistor is a part of a light-emission control line fed with a light-emission control signal that is common to the first gate electrode for the power source supply transistor and the first gate electrode for the light-emission control transistor.

Aspect 21

The display device according to, for example, aspect 15, wherein each of the second initialization transistor in the pixel circuit in a current stage and the first initialization transistor in the pixel circuit in a succeeding stage includes the second transistor, and each of the second gate electrode for the second initialization transistor in the pixel circuit in the current stage and the second gate electrode for the first initialization transistor in the pixel circuit in the succeeding stage is a part of a scan signal line fed with a scan signal that is common to the second gate electrode for the second initialization transistor in the pixel circuit in the current stage and the second gate electrode for the first initialization transistor in the pixel circuit in the succeeding stage.

Aspect 22

The display device according to, for example, any one of aspects 15 to 21, wherein the first initialization power source line and the high-voltage power source line are a common wire.

Aspect 23

The display device according to, for example, any one of aspects 15 to 22, wherein the second initialization power source line receives the same voltage as a second electrode of the light-emitting element does.

The invention claimed is:

1. A display device, comprising:
   a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order; and
   a first transistor including the crystalline silicon semiconductor layer, and a second transistor including the oxide semiconductor layer,
   the crystalline silicon semiconductor layer including a first channel region and a first conductor region,
   the oxide semiconductor layer including a second channel region and a second conductor region, wherein
   the first gate insulating film and the first interlayer insulating film are provided with a first contact hole exposing the first conductor region and electrically connecting together the first conductor region and the second conductor region,
   the lower metal layer includes a lower wire,
   the lower wire is in contact with the first conductor region in the first contact hole, and
   the first conductor region and the second conductor region are electrically connected together through the lower wire, wherein
   the lower wire is provided in such an insular manner that the lower wire has a top face and side faces thereof covered with the second conductor region.

2. The display device according to claim 1, further comprising
   a third interlayer insulating film provided between the lower metal layer and the oxide semiconductor layer.

3. The display device according to claim 1, wherein
   the second gate insulating film is provided to match the second gate electrode.

4. The display device according to claim 1, wherein
   the second gate insulating film covers a top face and side faces of the second conductor region.

5. The display device according to claim 1, wherein
   the upper metal layer includes an upper wire,
   the second interlayer insulating film has a second contact hole exposing the second conductor region and electrically connecting together the second conductor region and the upper wire, and
   the upper wire is in contact with the second conductor region in the second contact hole.

6. The display device according to claim 5, wherein
   the second conductor region located over the first contact hole and the second conductor region located over the second contact hole are different conductor regions sandwiching the same second channel region.

7. The display device according to claim 1, wherein
   the second conductor region is in contact with a part of the first conductor region in the first contact hole.

8. The display device according to claim 1, wherein
   the lower wire has an end thereof in the first contact hole.

9. The display device according to claim 1, wherein
   the lower wire is provided in an insular manner in the first contact hole, and
   the second conductor region is in contact with a part of the first conductor region around the lower wire.

10. The display device according to claim 1, wherein
    the upper metal layer includes a metal wire,
    the first gate insulating film, the first interlayer insulating film, and the second interlayer insulating film are provided with a third contact hole exposing the first conductor region and electrically connecting together the first conductor region and the metal wire, and
    in the third contact hole, the metal wire is in contact with the first conductor region.

11. The display device according to claim 10, wherein
    the first conductor region located over the first contact hole and the first conductor region located over the third contact hole are different conductor regions sandwiching the same first channel region.

12. The display device according to claim 1, wherein
    the upper metal layer includes a gate connection wire,
    the first interlayer insulating film and the second interlayer insulating film are provided with a fourth contact hole exposing the first gate electrode and electrically connecting together the first gate electrode and the gate connection wire, and
    in the fourth contact hole, the gate connection wire is in contact with the first gate electrode.

13. The display device according to claim 1, wherein
    the lower metal layer includes an opposite electrode,
    the upper metal layer includes an electrode wire,
    the second interlayer insulating film is provided with a fifth contact hole exposing the second conductor region, and
    the second conductor region covering the opposite electrode is in contact with the electrode wire in the fifth contact hole.

14. The display device according to claim 1, further comprising:
    a light-emission element; and a pixel circuit configured to control the light-emission element, the light-emission element and the pixel circuit corresponding to a subpixel, wherein
    the pixel circuit includes: a drive transistor configured to control a current of the light-emission element; a first initialization transistor connected between a first initialization power source line and a control terminal of the drive transistor; a threshold control transistor connected between a drain region and the control terminal of the drive transistor; a write control transistor connected between a source region of the drive transistor and a data signal line; a power source supply transistor connected between the drain region of the drive transistor and a high-voltage power source line; a light-emission control transistor connected between the source region of the drive transistor and a first electrode of the light-emission element; a second initialization transistor connected between the first electrode of the light-emission element and a second initialization power source line; and a capacitor connected to the control terminal of the drive transistor and configured to hold a data signal.

15. The display device according to claim 14, wherein
    the drive transistor is the first transistor.

16. The display device according to claim 14, wherein
    the lower metal layer includes the opposite electrode, and
    the first gate electrode and the opposite electrode, overlapping via the first interlayer insulating film, form the capacitor.

17. The display device according to claim 14, wherein
    at least one of the first initialization transistor, the threshold control transistor, and the second initialization transistor is the second transistor.

18. The display device according to claim 14, wherein
the threshold control transistor is the second transistor,
the write control transistor is the first transistor,
the first gate electrode corresponding to the write control transistor is a portion of a lower scan signal line, and
the second gate electrode corresponding to the threshold control transistor is a portion of an upper scan signal line, and
the lower scan signal line and the upper scan signal line receive a scan signal in common between the lower scan signal line and the upper scan signal line.

19. The display device according to claim 14, wherein
each of the power source supply transistor and the light-emission control transistor includes the first transistor, and
each of the first gate electrode for the power source supply transistor and the first gate electrode for the light-emission control transistor is a part of a light-emission control line fed with a light-emission control signal that is common to the first gate electrode for the power source supply transistor and the first gate electrode for the light-emission control transistor.

20. The display device according to claim 14, wherein
each of the second initialization transistor in the pixel circuit in a current stage and the first initialization transistor in the pixel circuit in a succeeding stage includes the second transistor, and
each of the second gate electrode for the second initialization transistor in the pixel circuit in the current stage and the second gate electrode for the first initialization transistor in the pixel circuit in the succeeding stage is a part of a scan signal line fed with a scan signal that is common to the second gate electrode for the second initialization transistor in the pixel circuit in the current stage and the second gate electrode for the first initialization transistor in the pixel circuit in the succeeding stage.

* * * * *